United States Patent [19]

Iwamatsu

[11] Patent Number: 5,071,832
[45] Date of Patent: Dec. 10, 1991

[54] FIELD EFFECT TYPE JOSEPHSON TRANSISTOR

[75] Inventor: Seiichi Iwamatsu, Nagano, Japan

[73] Assignee: Seiko Epson Corporation, Tokyo, Japan

[21] Appl. No.: 423,969

[22] Filed: Oct. 19, 1989

[30] Foreign Application Priority Data

| Oct. 25, 1988 | [JP] | Japan | 63-268518 |
| Oct. 25, 1988 | [JP] | Japan | 63-268519 |
| Oct. 25, 1988 | [JP] | Japan | 63-268521 |
| Oct. 25, 1988 | [JP] | Japan | 63-268527 |
| Oct. 28, 1988 | [JP] | Japan | 63-272349 |
| Nov. 11, 1988 | [JP] | Japan | 63-285071 |

[51] Int. Cl.⁵ ............... H01L 39/22; H01L 29/10; H01L 39/12; H01B 12/00
[52] U.S. Cl. .................... 505/1; 357/4; 357/5; 357/23.3; 505/702; 505/874
[58] Field of Search ........... 357/5, 23.3; 505/1, 505/702, 874

[56] References Cited

U.S. PATENT DOCUMENTS

| 4,675,711 | 6/1987 | Harder et al. ............... 357/5 |
| 4,843,446 | 6/1989 | Nishino et al. ............ 357/23.3 |
| 4,884,111 | 11/1989 | Nishino et al. ............... 357/5 |
| 4,888,629 | 12/1989 | Harada et al. ................ 357/5 |

FOREIGN PATENT DOCUMENTS

| 60-68681 | 4/1985 | Japan .................. 357/5 |
| 61-206278 | 9/1986 | Japan .................. 357/5 |
| 63-302582 | 12/1988 | Japan .................. 357/5 |
| 1-133381 | 5/1989 | Japan .................. 357/5 |

OTHER PUBLICATIONS

European Patent Application #88103402.9, Ishida, Date of Publication of Application: 9/7/88.

Primary Examiner—Rolf Hille
Assistant Examiner—Mahshid Saadat
Attorney, Agent, or Firm—Spensley Horn Jubas & Lubitz

[57] ABSTRACT

A field effect type Josephson transistor in which a source electrode and a drain electrode are provided with a gap therebetween, a tunnel film is provided in the gap between the source electrode and drain electrode, and a gate electrode for field-controlling the tunnel current through the tunnel film is provided. The transistor of such structure is suitable for mass-production and is utilized in manufacture of integrated circuits.

8 Claims, 4 Drawing Sheets

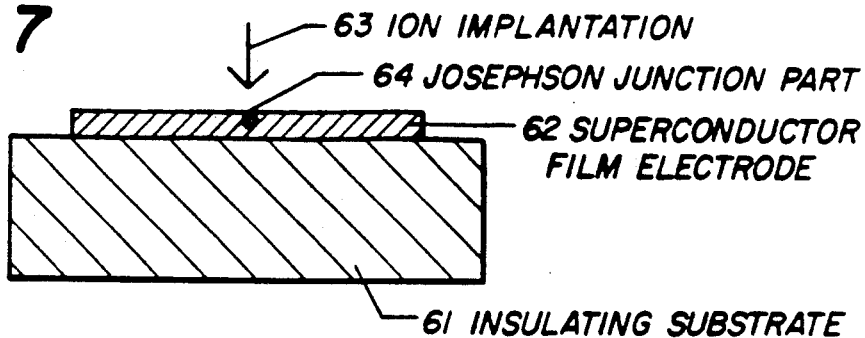
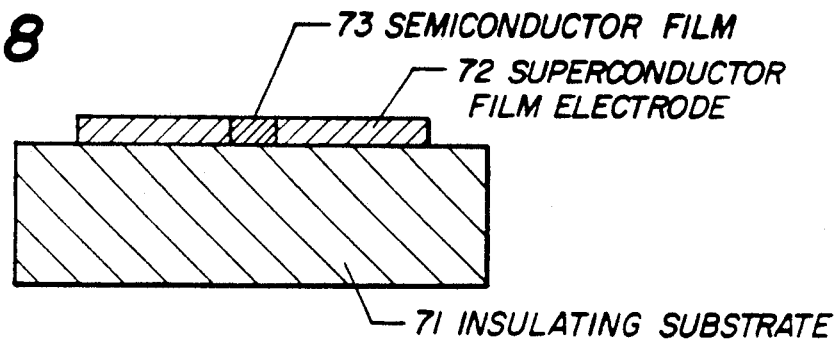
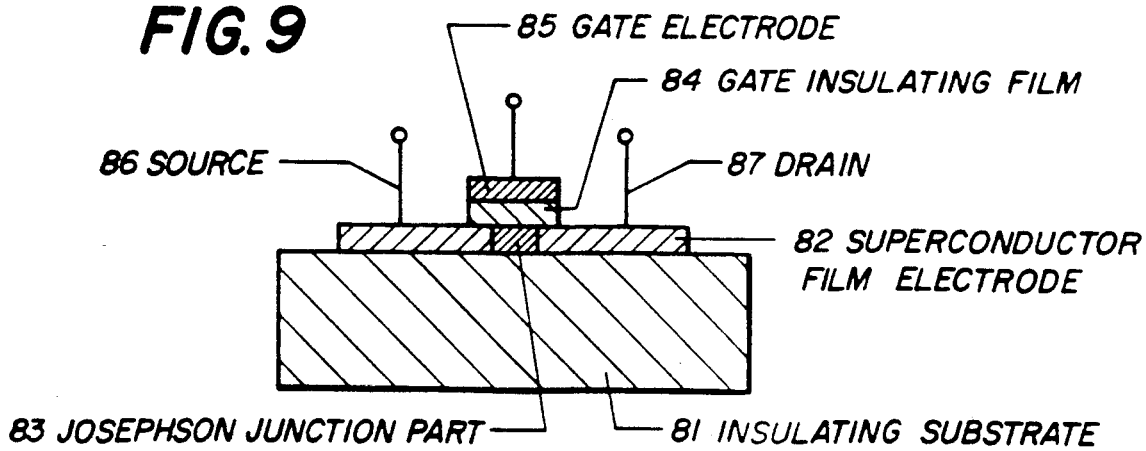
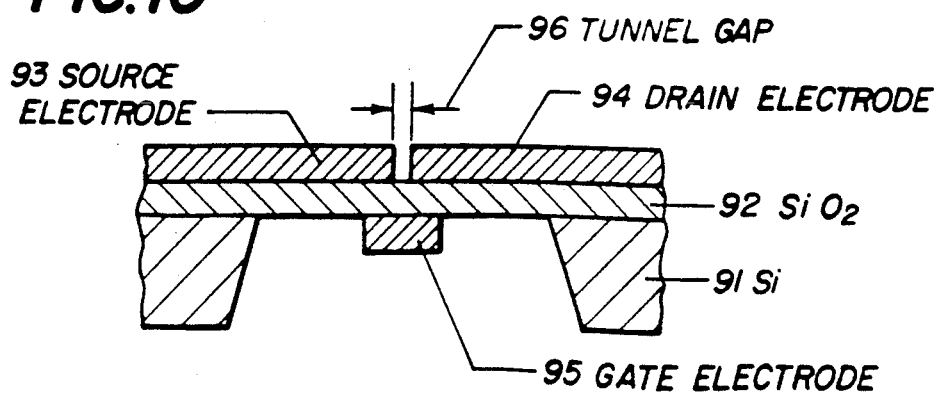

FIELD EFFECT TYPE JOSEPHSON TRANSISTOR

BACKGROUND OF THE INVENTION

1. Field of the Invention

The present invention relates to structures of a field effect type Josephson transistor and a method for manufacturing the same.

2. Prior Art

Hitherto, a diode based on a Josephson effect has been known but a transistor based on the same is not known.

A field effect type Josephson transistor has heretofore been proposed, a sectional view of which is illustrated in FIG. 10 where (91) is Si, (92) is $SiO_2$, (93) is a source electrode, (94) is a drain electrode, (95) is a gate electrode and (96) is a tunnel gap. Specifically, $SiO_2$ layer (92) is formed on Si substrate (91), gate electrode (95) is made of Nb or the like in a recess formed on the back surface of Si substrate (91) with the $SiO_2$ layer (92) serving as a dielectric film, and source electrode (93) and drain electrode (94) are made of Nb or the like above gate electrode (95) so as to form tunnel gap (96) of several 10 Å in width therebetween.

However, the prior art technique has a problem in that formation of such tunnel gap of several 10 Å by photolithography and etching technology is extremely difficult.

In addition, it has another problem that formation of integrated circuits containing such devices is difficult.

Further, the prior art has still another problem in that accurate control of the tunnel current by the gate field is difficult since the tunnel gap is formed on the surface of the $SiO_2$ or the like dielectric film to cause formation of a surface leakage current on the surface of the dielectric film, and the thus formed leakage current would be combined with the tunnel current.

SUMMARY OF THE INVENTION

Under the situation, one object of the present invention is to overcome the said problems in the prior art and to provide a mass-producible field effect type Josephson transistor structure.

Another object of the present invention is to provide a mass-producible field effect type Josephson transistor structure which may be utilized in manufacture of integrated circuits.

Still another object of the present invention is to provide a novel field effect type Josephson transistor structure which is free from the drawbacks caused by the surface leakage current on the surface of the gate dielectric film of the transistor.

In order to attain the said objects, the present invention provides:

(1) a field effect type Josephson transistor in which a source electrode and a drain electrode are provided with a gap therebetween, a tunnel film is provided on the side walls of the gap between the source electrode and drain electrode, a substrate electrode is provided in series with the tunnel film, and a gate electrode for field-controlling the tunnel current flowing through the tunnel film is formed on a dielectric film;

(2) a field effect type Josephson transistor in which a gate electrode is formed on an insulating substrate, a tunnel gap between source and drain electrodes is provided on the surface of the gate electrode, and a tunnel film is formed in the inside of the tunnel gap;

(3) a field effect type Josephson transistor in which a tunnel insulating film is formed in the tunnel gap between two interconnected electrodes made of a ceramic high-temperature superconductor film, the electrodes being formed on an insulating substrate, and a gate electrode is formed on a dielectric film on the surface of the tunnel insulating film.

(4) a field effect type Josephson transistor in which a superconductor film is formed on an insulating substrate, a source electrode and a drain electrode are formed on the superconductor film with a tunnel gap therebetween, and a gate electrode is formed on the side wall of the tunnel gap;

(5) a field effect type Josephson transistor in which a superconductor film interconnection is provided on an insulating substrate, a tunnel gap is provided on the superconductor film interconnection, and a gate electrode is formed on the side wall of the tunnel gap;

(6) a field effect type Josephson transistor as described at (5) above in which two or more tunnel gaps are provided on the superconductor film interconnection as provided on the insulating substrate, and a jointed gate electrode is provided on the side wall of the two or more tunnel gaps; and (7) a method of forming a Josephson junction, which is characterized by implantation of ions or formation of a semiconductor film in the Josephson junction-forming part in a superconductor electrode film.

BRIEF DESCRIPTION OF THE DRAWINGS

FIG. 1 through FIG. 9 are sectional views of embodiments of field effect type Josephson transistors according to the present invention.

FIG. 10 is a sectional view of a conventional field effect type Josephson transistor.

DESCRIPTION OF THE PREFERRED EMBODIMENTS

The present invention will be explained in detail by reference to several preferred embodiments.

Figure 1:
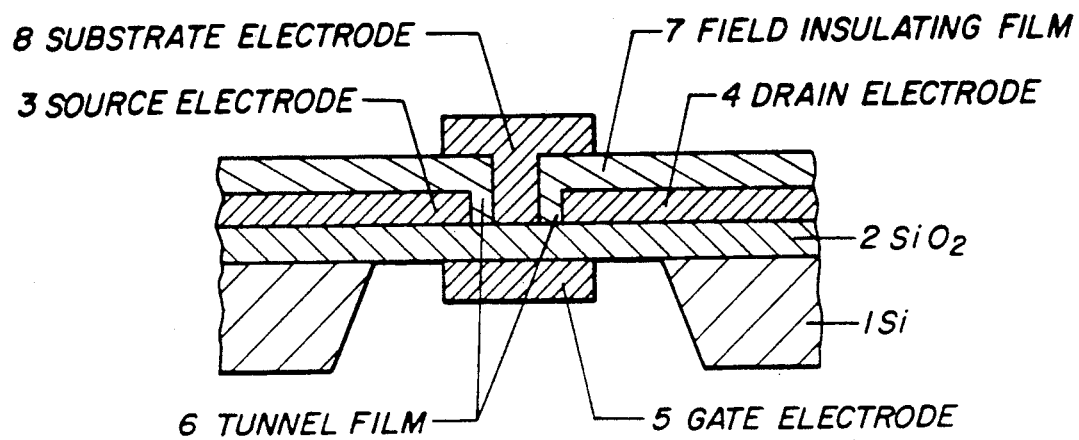

FIG. 1 shows a sectional view of one embodiment of the field effect type Josephson transistor of the present invention where (1) is a substrate or layer of Si, (2) is a layer of $SiO_2$, (3) is a source electrode, (4) is a drain electrode, (5) is a gate electrode, (6) are tunnel films, (7) is a field insulating film, and (8) is a substrate electrode. Specifically, $SiO_2$ layer (2) is formed on the surface of Si substrate (1), the back surface of Si substrate (1) is etched to form gate electrode (5), source electrode (3) and drain electrode (4) are formed on $SiO_2$ layer (2) above gate electrode (5) with a somewhat broad gap between electrodes 3 and 4, field insulating film (7) is provided as a thick film on the surfaces of the source electrode (3) and drain electrode (4), while tunnel films (6) having a thickness of several 10 Å, preferably 10–50 Å, are formed on the side walls of electrodes 3 and 4, and substrate electrode (8) is formed to fill the remainder of the relatively broad gap between electrodes 3 and 4.

As the materials for forming electrodes 3, 4 and 8 use may be made of superconductors such as Nb and $Y_1Ba_2Cu_3O_7$; and as the tunnel films 6, a dielectric film made of, for example, NbO or $SiO_2$ is employed.

The substrate 1 is not limited to only Si but may be an insulator such as glass. In the latter case, gate electrode 5 may be laminated on the glass substrate.

In this embodiment, two Josephson effect elements are combined to each other in series. Where two gate electrodes are independently arranged, the transistor would also function as a two-gate field effect Josephson transistor.

Figure 2:
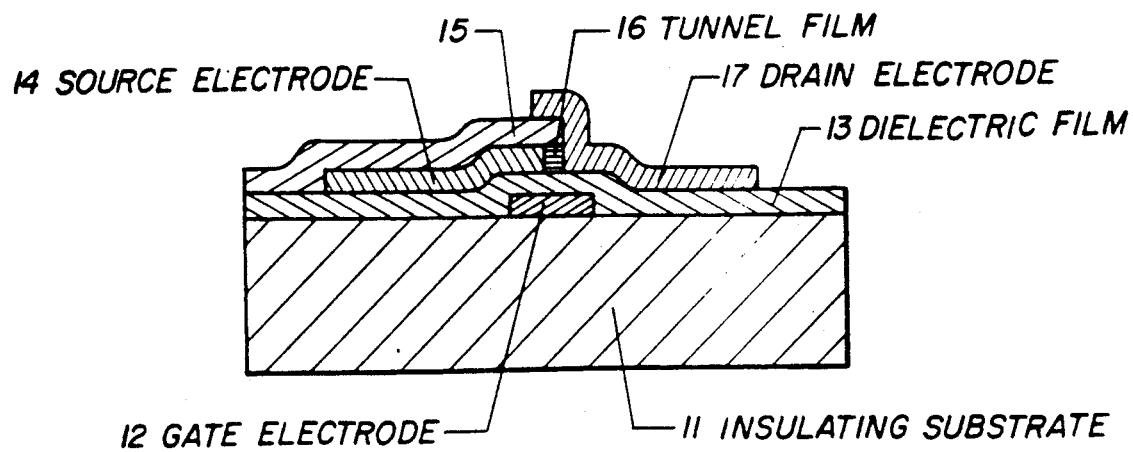

FIG. 2 shows a sectional view of another embodiment of a field effect type Josephson transistor of the present invention where (11) is an insulating substrate, (12) is a gate electrode, (13) is a dielectric film, (14) is a source electrode, (15) is an interlayer insulating film, (16) is a tunnel film, and (17) is a drain electrode.

Specifically, gate electrode (12) made of a ceramic superconductor film such as $Y_1Ba_2Cu_3O_7$ or the like film is formed on the surface of insulating substrate (11) made of glass or ceramic. Then, dielectric film (13) made of, for example, $SiO_2$, $Si_3N_4$ or $Al_2O_3$ is formed by a CVD process, then source electrode (14) made of a ceramic superconductor film is formed, interlayer insulating film (15) made of $SiO_2$, $Si_3N_4$ or $Al_2O_3$ is formed by a CVD process on the surface of source electrode (14), tunnel film (16) having a thickness of the order of 2 nm and made of $SiO_2m$, $Si_3N_4$ or $Al_2O_3$ is formed by a CVD process on the side wall of source electrode (14) above gate electrode (12), and then drain electrode (17) made of a ceramic superconductor film is formed so as to sandwich tunnel film (16) between drain electrode (17) and source electrode (14).

FIGS. 3 show sectional views to illustrate the steps of forming still another embodiment of the field effect type Josephson transistor of the present invention, where (21) is an insulating substrate, (22) is a superconductor film, (23) is a source electrode, (24) is a drain electrode, (25) is a tunnel gap, (26) is a dielectric film, (27) is an electrode film, (28) is a tunnel insulating film, and (29) is a gate electrode.

Figure 3A:
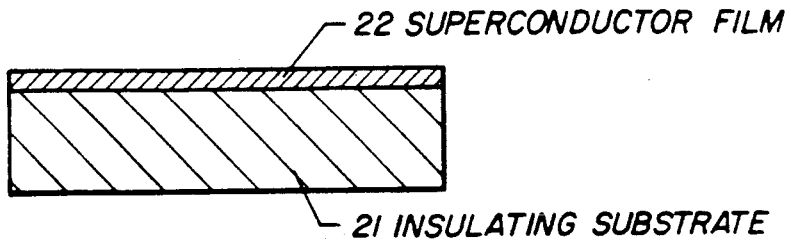
Figure 3B:
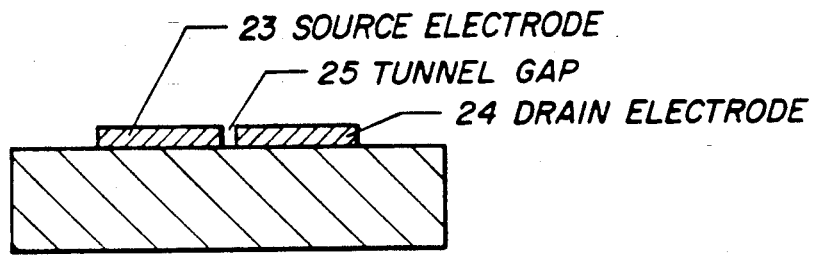
Figure 3C:
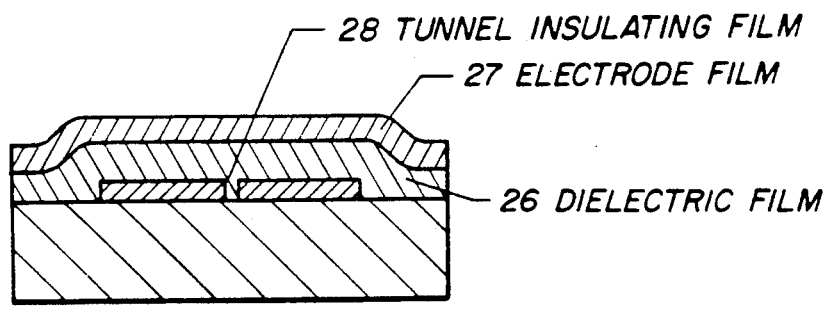
Figure 3D:
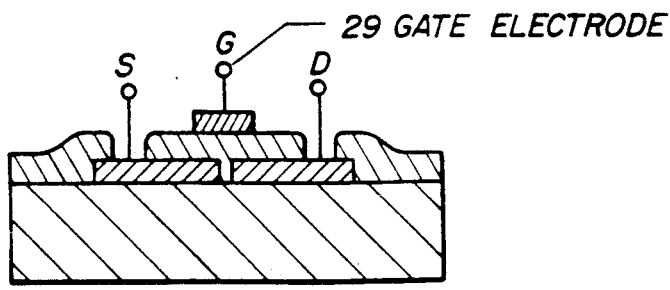

Specifically, in FIG. 3(a), $Y_1Ba_2Cu_3O_7$ or the like high-temperature ceramic superconductor film (22) is formed to a thickness of the order of $0.1\mu$ to $1\mu$ on the surface of insulating substrate (21) made of, for example, strontium titanate, magnesium oxide, sapphire or quartz and in FIG. 3(b) superconductor film (22) is etched by a photoetching process or an ion beam-etching process, or the superconductor film (22) is insulated by partial oxygen ion-implantation, whereby source electrode (23), drain electrode (24) and tunnel gap (25) having a width of from $0.002\mu$ to $0.1\mu$ are formed. In the case of ion implantation, the ion-implanted layer may be retained as an isolation domain or the ion-implanted layer may be retained in the tunnel gap so as to form the tunnel-insulating film. Next, as shown in FIG. 3(c), dielectric film (26) made of $SiO_2$, $Al_2O_3$, $Si_2N_4$, or a mixture thereof and composed of a plurality of layers of those compositions is formed by a CVD process or the like to form tunnel insulating film (28) whereupon the inside of the tunnel gap (25) is also filled with the material of this dielectric film. Then, electrode film (27) made of Al, Cu or $Y_1Ba_2Cu_3O_7$ or the like high-temperature ceramic superconductor film is formed, and, as shown in FIG. 3(d), electrode film (27) is photoetched to form gate electrode 29, film 26 is etched to expose electrodes 23 and 24, and Ag electrodes or the like leader electrodes are formed. Accordingly, a field effect type Josephson transistor composed of source (S), drain (D) and gate (G) is formed.

Figure 4:
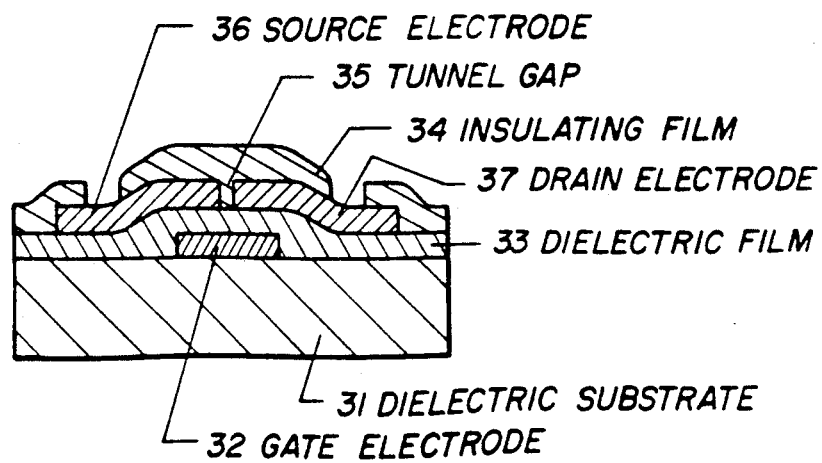

FIG. 4 shows still another embodiment of the present invention, where (31) is an insulating substrate, (32) is a gate electrode, (33) is a dielectric film, (34) is an insulating film, (35) is a tunnel gap, (36) is a source electrode, and (37) is a drain electrode.

Specifically, first gate electrode (32) is formed on the surface of insulating substrate (31), and dielectric film 33 is formed on substrate 31 and electrode 32. Then, source electrode (36), drain electrode (37) and tunnel gap (35) are formed on dielectric film (33), and insulating film (34) made of $SiO_2$ or $Si_3N_4$ is formed. Tunnel gap (35) is formed above gate electrode (32) on dielectric film (33). Where source electrode (36) and drain electrode (37) are formed by partial oxygen ion-implantation into a high temperature superconductor film, the thus ion-implanted layer is to be also an isolation layer like the embodiment described above with reference to FIGS. 3.

Figure 5A:
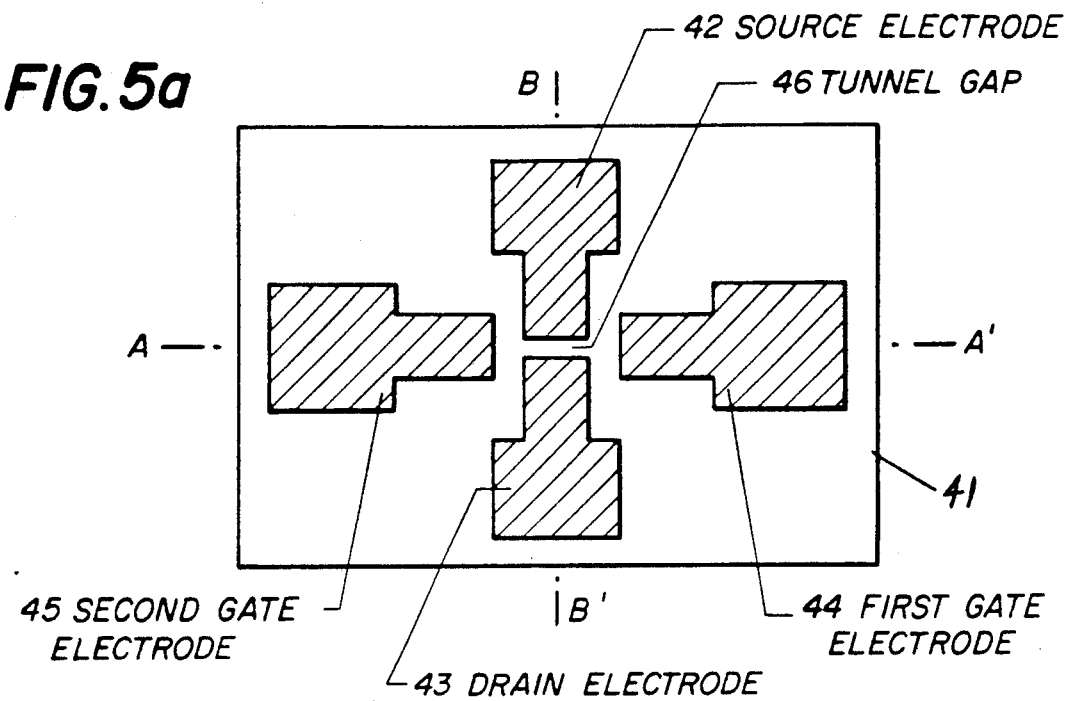
Figure 5B:
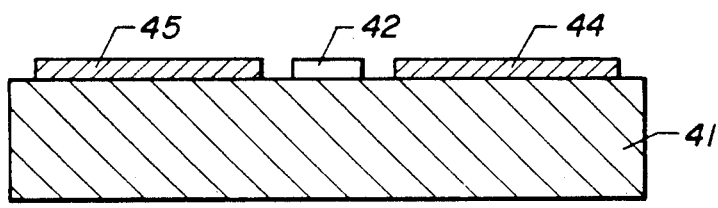
Figure 5C:
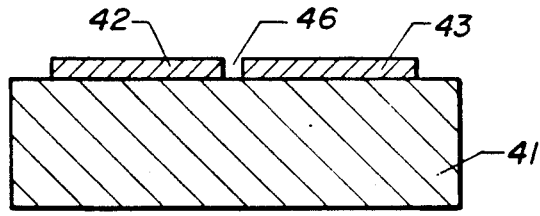

FIGS. 5 show a plan view and sectional views to illustrate still another embodiment of the field effect type Josephson transistor of the present invention. FIG. 5(b) is a cross-sectional view along line A—A' of FIG. 5(a) and FIG. 5(c) is a cross-sectional view along line B—B' of FIG. 5(a). In this embodiment, (41) is an insulating substrate, (42) is a source electrode, (43) is a drain electrode, (44) is a first gate electrode, (45) is a second gate electrode and (46) is a tunnel gap.

Specifically, a superconductor film made of $Y_1Ba_2Cu_3O_7$ or Nb is formed on the surface of insulating substrate (41) made of strontium titantate single crystal or the like, and then source electrode (42), drain electrode (43), tunnel gap (46), first gate electrode (44) and second gate electrode (45) are formed in one step. Formation of such electrodes may not be effected by photoetching but may be by oxygen ion-implantation around the electrodes so as to insulate the various electrodes from one another.

In addition, tunnel gap (46) may be filled with tunnel film such as $SiO_2$ film or the like, or a dielectric film such as $SiO_2$ film or the like may be formed on the complete surface thereof and holes may be formed for connecting contact leads to the electrodes.

In the present embodiment, first gate electrode (44) and second gate electrode (45) are formed, but the structure may have only one of them. For operation of the transistor, first gate electrode (44) and second gate electrode (45) may be supplied with the same gate voltage, or potential, or different gate voltages.

In the embodiments of FIGS. 4 and 5, each tunnel gap (35), (46) may have a width of the order of 10 Å to $1\mu$, and preferably 10-50 Å.

Figure 6:
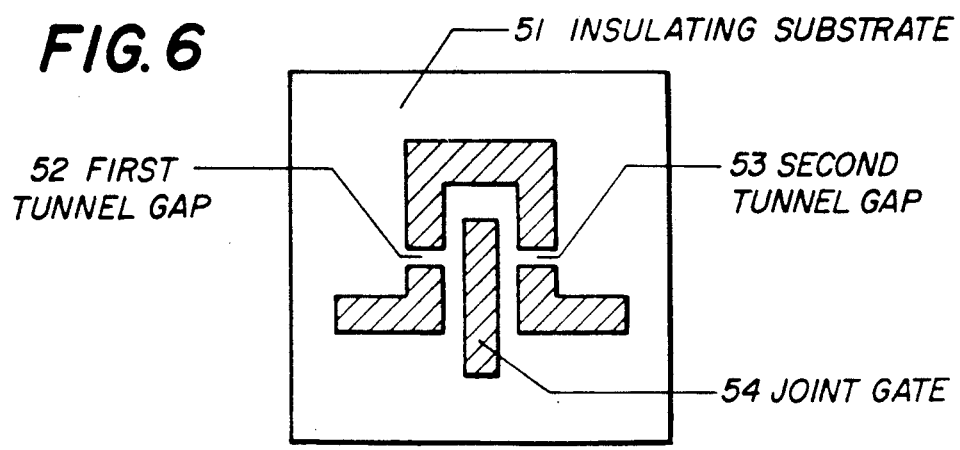

FIG. 6 shows a plan view to illustrate still another embodiment of the field effect type Josephson transistor of the present invention, where (51) is an insulating substrate, (52) is a first tunnel gap, (53) is a second tunnel gap and (54) is a joint gate.

Specifically, a high-temperature superconductor film made of, for example, $Y_1Ba_2Cu_3O_7$ is formed to a thickness of the order of $0.1\mu$ on the surface of insulating substrate (51) made of, for example, barium titanate, electrodes are formed by ion beam-etching or the like to form the first tunnel gap (52) and the second tunnel gap (53) each with a width of the order of $0.01\mu$, and joint gate (54) is formed near the side walls of the said first tunnel gap (52) and second tunnel gap (53) with a spacing of the order of $0.1\mu$ from both gap-side walls.

After electrode interconnection, an $SiO_2$ film may be formed on the complete surface whereby the inside of the tunnel gaps as well as the space between the jointed gate and the tunnel gaps may be filled with the $SiO_2$ film or the like dielectric film. Alternatively, electrode interconnection may be effected by pattern-like implantation of ions such as oxygen ions into the superconductor film.

In addition, a thick insulating film may be formed on the tunnel gaps and overlapped and thereafter a metal electrode such as Al electrode may be formed to contact the joint gate (54).

FIG. 7 shows a sectional view to illustrate one embodiment of the method of forming a Josephson junction, where (61) is an insulating substrate, (62) is a superconductor film, (63) is an ion-implantation beam, and (64) is a Josephson junction part.

Specifically, superconductor film electrode (62) made of $Y_1Ba_2Cu_3O_7$ or the like high-temperature ceramic superconductor film is formed to a thickness of the order of $0.1\mu$ on the surface of insulating substrate (61) made of $TiSiO_3$, and an oxygen ion beam is applied to form the Josephson junction part in superconductor film electrode (62) at an accelerated rate through an aperture of the order of 10 to 20 Å for ion-implantation (63) to thereby form Josephson junction part (64). By this treatment, $Y_1Ba_2Cu_3O_7$ is thus processed to contain excess oxygen whereby the film is made insulated or semiconductive to be a tunnel film. For ion-implantation, not only oxygen but also any other elemental ions may also be employed. Alternatively, for forming Josephson junction part (64), a photo-resist film having a gap of about 10 Å may be formed on the surface of superconductor film electrode (62) and ion-implantation (63) may be applied to the complete surface thereof to form Josephson junction part (64) in the said gap part.

FIG. 8 shows a sectional view to illustrate still another embodiment of the Josephson junction to be formed by the present invention, where (71) is an insulating substrate, (72) is a superconductor film electrode, and (73) is a semiconductor film.

Specifically, superconductor film electrode (72) having a thickness of the order of $0.1\mu$ is formed on the surface of insulating substrate (71), a gap of about 200 Å is formed in the Josephson junction-forming part of superconductor film (72) by photo-etching or ion beam-etching, and Si or the like semiconductor film (73) is filled into the gap to give the Josephson junction. The semiconductor film (73) may be partly formed by an ion beam-CVD process. Alternatively, a semiconductor film is formed on the complete surface of superconductor film electrode (72) by a CVD process or a sputtering process, and the thus formed film is subjected to etchback by sputter-etching, plasma-etching or the like etching treatment so that the semiconductor film (73) may be only in the inside of the gap. Semiconductor film (73) may be either in the amorphous state or polycrystalline state, but it may also be a single-crystalline state of 200 Å or so after annealing treatment for single-crystallization. In addition, semiconductor film (73) may be made of not only Si but also any other semiconductor such as GaAs, InP, SiC, Se or Ge. In any event, in the present embodiment, the Josephson junction part is formed of a semiconductor film and therefore, it may have a function as a tunnel film even though the width thereof is 200 Å or so. In this connection, where the Josephson junction part is formed of an insulating film, the width thereof is to be 20 Å or so.

FIG. 9 shows a sectional view to illustrate one embodiment of using the field effect type Josephson transistor of the present invention, where (81) is an insulating substrate, (82) is a superconductor film electrode, (83) is a Josephson junction part, (84) is a gate insulating film, (85) is a gate electrode, (86) is a source and (87) is a drain.

Specifically, superconductor film electrode (82) is formed to a thickness of the order of $0.1\mu$ on the surface of insulating substrate (81), Josephson junction part (83) is formed on superconductor film electrode (82) by a process as described with reference to FIG. 8, gate insulating film (84) made of $SiO_2$ film or the like is formed on the surface of Josephson junction part (83) by a CVD process or the like to a thickness of about $0.01\mu$ to $0.1\mu$, and gate electrode (85) is formed on gate insulating film (84). Accordingly, one part of the superconductor film electrode (82) is a source (86) and the other part thereof is a drain (87), both being formed in opposite positions of electrode 82 with the Josephson junction part (83) therebetween.

In accordance with the present invention which has been explained in detail above, the following advantages are attained.

(1) Structures of a mass-producible field effect type Josephson transistor are provided.
(2) Field effect type Josephson transistors suitable for integrated circuits are formed.
(3) Field effect type Josephson transistors which are free from drawbacks caused by surface leakage current on the surface of the gate dielectric film of the transistor are prepared.
(4) The process of forming field effect type Josephson transistors is simplified.
(5) High density construction of integrated circuit devices having field effect type Josephson transistor structure is possible.
(6) Methods of forming Josephson junction with high reproducibility and mass-producibility are provided.

This application relates to subject matter disclosed in Japanese Applications No. 268518/88, filed Oct. 25, 1988, No. 268519/88, filed Oct. 25, 1988, No. 268521/88, filed Oct. 25, 1988, No. 268527/88, filed Oct. 25, 1988, No. 272349/88, filed Oct. 28, 1988, and No. 285071/88, filed Nov. 11, 1988, the disclosures of which are incorporated herein by reference.

While the invention has been described in detail and with reference to specific embodiments thereof, it will be apparent to one skilled in the art that various changes and modifications can be made therein without departing from the spirit and scope thereof.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A field effect type Josephson transistor comprising: a source electrode and a drain electrode, wherein each of said electrodes is composed of superconducting material, said electrodes being separated from one another by a gap and each having a side wall bounding said gap; two tunnel films each disposed in said gap on a respective side wall, a substrate electrode disposed in said gap and interposed between said tunnel films; a gate electrode disposed for controlling a current flowing through said gap between said source and drain electrodes; and a dielectric film disposed between said gap and said gate electrode.

2. A transistor as defined in claim 1 wherein each of said electrodes is composed of superconductor material and each said tunnel film is composed of a dielectric material and has a thickness of the order of several times 10 Å.

3. A field effect type Josephson transistor comprising: an insulating substrate; a gate electrode formed on said substrate; a gate insulating film covering said gate electrode; source and drain electrodes formed of superconducting material disposed on said gate insulating film and separated from one another by a tunnel gap located above said gate electrode; and a tunnel film disposed within said gap.

4. A transistor as defined in claim 3 wherein each of said electrodes is composed of a superconductor material and said tunnel film is composed of a dielectric material and has a thickness of the order of 2 nm.

5. A field effect type Josephson transistor comprising: an insulating substrate; two electrodes of a ceramic high-temperature superconductor disposed on said substrate, said electrodes being separated from one another by a tunnel gap; a tunnel insulating film disposed in said gap; a dielectric film covering said gap; and a gate electrode formed on said dielectric film at a location above said gap, wherein said dielectric film is a gate insulating film interposed between said gate electrode and said tunnel gap and having a thickness of about 0.01 to $0.1\mu$.

6. A transistor as defined in claim 5, wherein said tunnel insulating film is composed of a dielectric material and has a thickness of the order of 0.002 to $0.1\mu$.

7. A field effect type Josephson transistor comprising: an insulating substrate; a superconductor film disposed on said substrate and separated into two parts lying in a common plane and constituting source and drain electrodes separated by a tunnel gap; and a gate electrode disposed in the common plane and spaced from said gap in a direction transverse to the direction of separation between said two parts.

8. A transistor as defined in claim 7 wherein said film is separated into at least three parts separated by at least two tunnel gaps, and said gate electrode is disposed adjacent each said gap.

* * * * *